(12) United States Patent
Dawkins

(10) Patent No.: US 11,910,572 B2
(45) Date of Patent: Feb. 20, 2024

(54) SEALED COMMUNICATIONS MODULE WITH MULTI-PATH THERMAL MANAGEMENT SYSTEM

(71) Applicant: PACIFIC STAR COMMUNICATIONS, INC., Portland, OR (US)

(72) Inventor: Dalton Dawkins, Portland, OR (US)

(73) Assignee: PACIFIC STAR COMMUNICATIONS, Portland, OR (US)

( * ) Notice: Subject to any disclaimer, the term of this patent is extended or adjusted under 35 U.S.C. 154(b) by 0 days.

(21) Appl. No.: 18/299,965

(22) Filed: Apr. 13, 2023

(65) Prior Publication Data
US 2023/0254999 A1 Aug. 10, 2023

Related U.S. Application Data

(62) Division of application No. 17/080,597, filed on Oct. 26, 2020, now Pat. No. 11,672,101.

(51) Int. Cl.
*H05K 7/20* (2006.01)
*H05K 5/06* (2006.01)
*H05K 7/14* (2006.01)

(52) U.S. Cl.
CPC .......... *H05K 7/20409* (2013.01); *H05K 5/06* (2013.01); *H05K 7/1427* (2013.01)

(58) Field of Classification Search
CPC ....................................................... H05K 5/00
See application file for complete search history.

(56) References Cited

U.S. PATENT DOCUMENTS

| | | | |
|---|---|---|---|
| 8,427,828 B2 | 4/2013 | Kehret et al. | |
| 2013/0141866 A1* | 6/2013 | Refai-Ahmed | H01L 23/3672 361/679.54 |
| 2017/0339805 A1* | 11/2017 | Lassini | H05K 7/20545 |

* cited by examiner

*Primary Examiner* — Jerry Wu
(74) *Attorney, Agent, or Firm* — Pearne & Gordon LLP

(57) ABSTRACT

A thermal management system for use in a sealed communications module and associated systems and methods are disclosed herein. In some embodiments, the communications model includes a sealed housing and a circuit board assembly having one or more heat-generating electronic components positioned within the housing. The thermal management system is coupled to the circuit board assembly and positioned to disperse heat from the one or more electronic components. The thermal management system includes a first thermal pathway, a second thermal pathway, and a third thermal pathway. The first thermal pathway has a first end attached to the circuit board assembly and a second end positioned near the side wall of the housing. The second thermal pathway is coupled to the second end of the first thermal pathway. The third thermal pathway is coupled to the second end of the first thermal pathway.

19 Claims, 7 Drawing Sheets

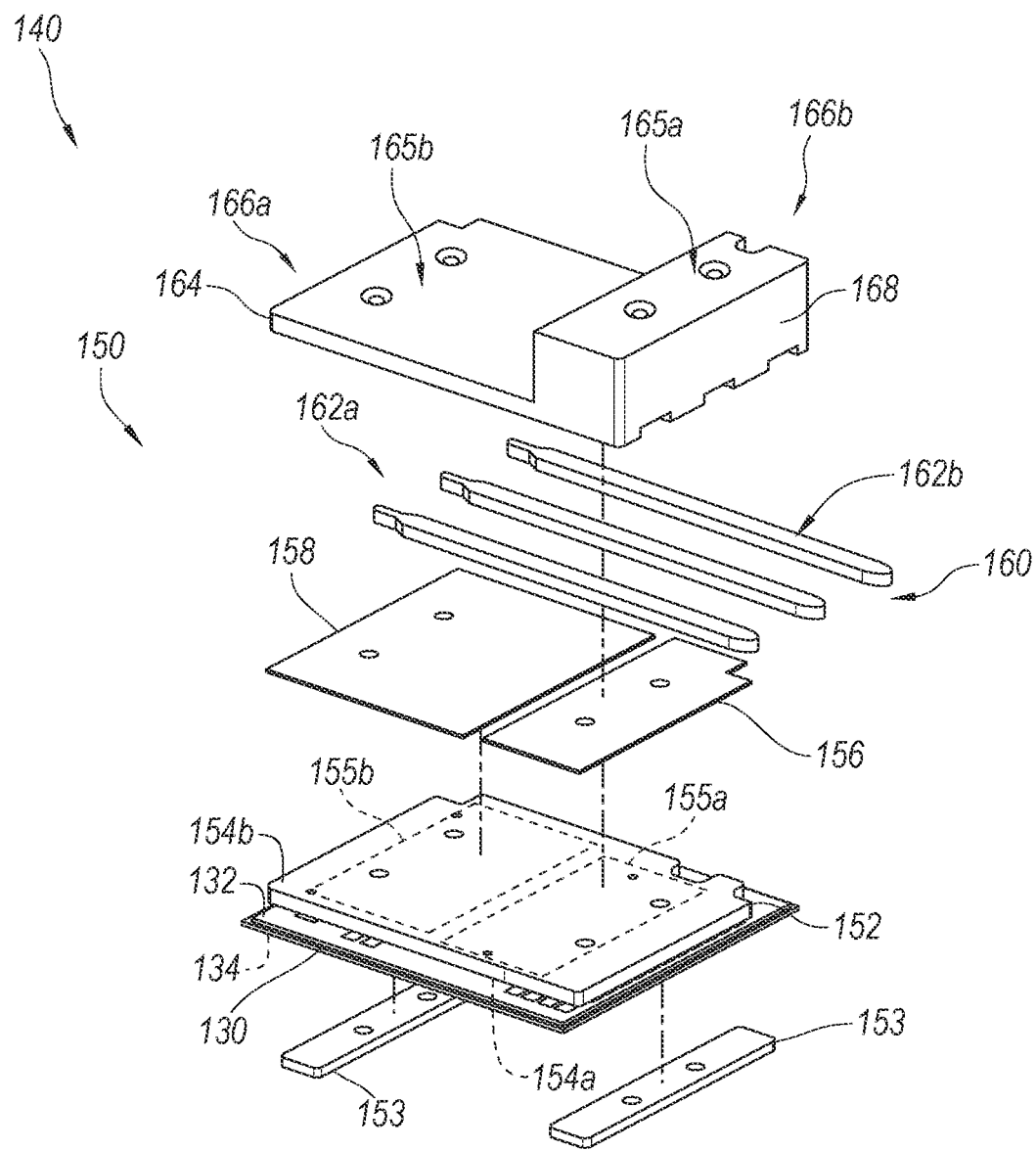
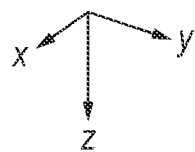
Fig. 3

SEALED COMMUNICATIONS MODULE WITH MULTI-PATH THERMAL MANAGEMENT SYSTEM

CROSS-REFERENCE TO RELATED APPLICATION

This application is a divisional of U.S. application Ser. No. 17/080,597, filed on Oct. 26, 2020. This application is incorporated herein by reference.

TECHNICAL FIELD

The present technology relates to communications modules. More specifically, the present technology relates to systems and methods for dispersing heat from hot components of sealed communications modules.

BACKGROUND

Conventional communications and information services equipment often have modular form factors, including modules configured to access a network, transmit or encrypt network traffic, host (run) software applications, store digital data or connect and conduct phone calls or video teleconferencing. The internal electronic components, such as integrated processors, power supply modules, and/or other electronic components can generate significant heat that must be effectively managed during operation of the module. In addition, conventional modules often are not well suited for use in harsh operating environments, including elevated ambient operating temperatures.

The maximum rated operating internal temperature of conventional modules is often a function of the amount of heat produced by the various internal electronic components during operation, the thermal limits of the components, the thermal management capacity of an associated cooling system, and the amount of heat expected to be removed from the module during operation at the maximum rated operating ambient air temperature (e.g., the amount of heat expected to be removed by a built-in thermal management system inside of the module). For example, if the ambient air temperature rises above the maximum rated operating ambient temperature for the module, at least one of the electronic components inside the module is likely to reach a core temperature above the maximum operating temperature for the corresponding electronic component(s). In some cases, this elevated temperature can reduce the performance or operating life of the module. As a result, conventional modules are often coupled to relatively large, complex cooling systems and the modules have an open or unconcealed configuration to allow airflow through the interior of the module. The internal electronic components in such non-sealed modules, however, are susceptible to exposure to moisture, water, dust, debris, etc., particularly in harsh environments. Accordingly, there is a need for an improved system for cooling electronic modules.

BRIEF DESCRIPTION OF THE DRAWINGS

FIG. 3 is a partially exploded isometric view of the components of a first thermal pathway of the thermal management system of FIG. 1.

Figure 1:
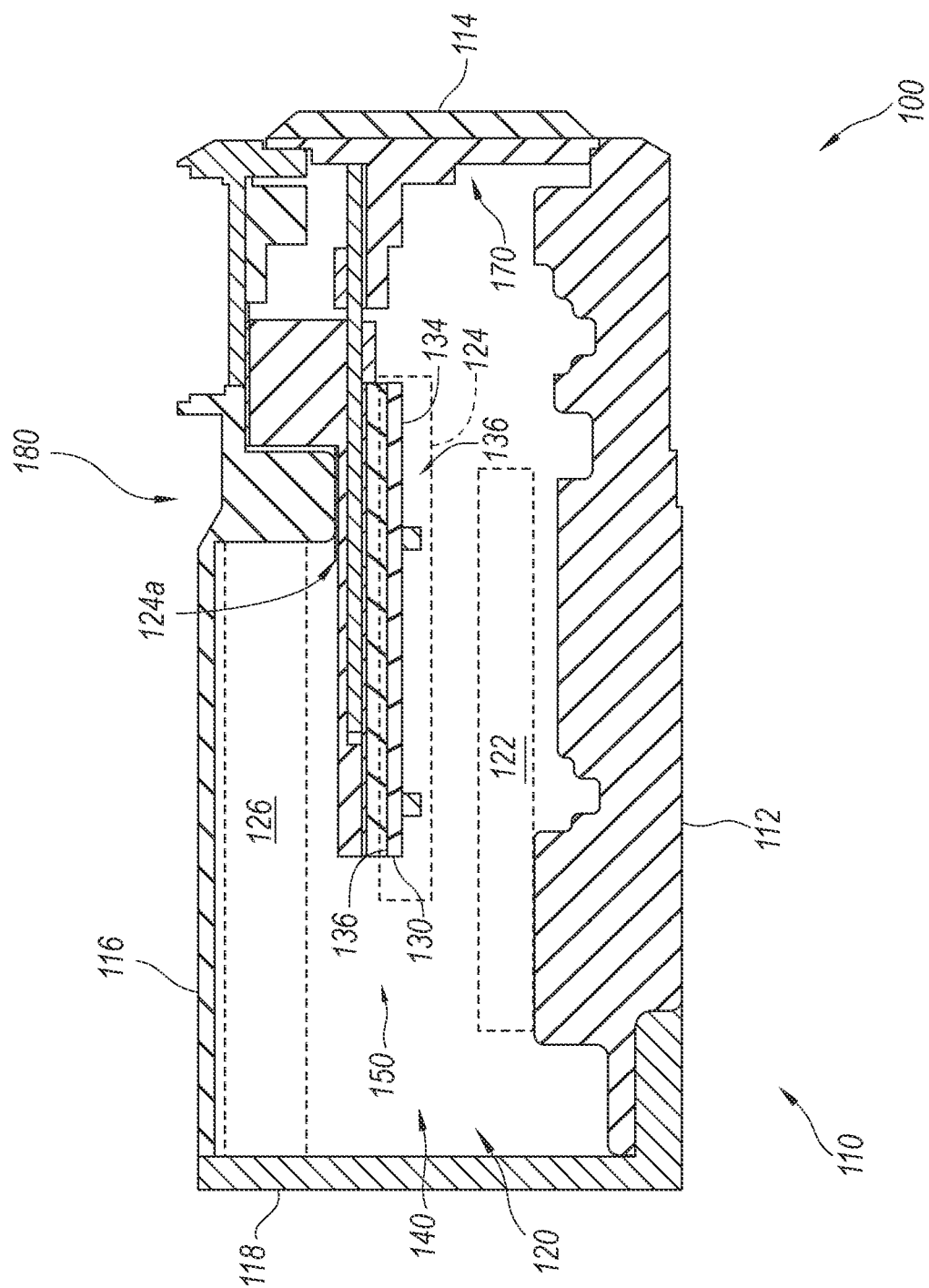
FIG. 1 is a cross-sectional side view of a communications module that includes a thermal management system in accordance with aspects of the present technology.

The drawings have not necessarily been drawn to scale. Similarly, some components and/or operations can be separated into different blocks or combined into a single block for the purpose of discussion of some of the implementations of the present technology. Moreover, while the technology is amenable to various modifications and alternative forms, specific implementations have been shown by way of example in the drawings and are described in detail below. The intention, however, is not to limit the technology to the particular implementations described. On the contrary, the technology is intended to cover all modifications, equivalents, and alternatives falling within the scope of the technology as defined by the appended claims.

DETAILED DESCRIPTION

Overview

The present technology is directed to electronic modules, such as sealed communications modules with a multi-path thermal management system, and associated systems and methods. The electronic modules contain one or more circuit board assemblies or cards that each have arrangements of heat-generating, electronic components. The thermal management system provides primary, secondary, and tertiary thermal pathways to efficiently draw heat away from the one or more cards within the module toward outer surfaces of the module. In some embodiments, the module is a sealed, field-deployable communications module that does not allow for airflow through the module's interior to disperse heat.

The communications module can include an exterior sealed housing having a top wall, a bottom wall, and side walls extending between the top and bottom walls and defining an interior area. The module further includes one or more onboard circuit board assemblies positioned within the interior between the top wall and the bottom wall. Further, the circuit board assembly includes one or more heat-generating electronic components. The thermal management system is coupled to at least one of the circuit board assemblies and is positioned to disperse and/or transport heat from the heat-generating electronic components toward the sealed housing's top wall, bottom wall, and/or a side wall.

The thermal management system in accordance with aspects of the present technology includes a first thermal pathway coupled to an intermediate card containing at least one of the circuit board assemblies, a second thermal pathway coupled to the first thermal pathway, and a third thermal pathway also coupled to the first thermal pathway. The thermal pathways are each configured to move the heat away from the circuit board assembly and to the exterior of the module, so as to dissipate heat from the module's sealed interior. For example, the first thermal pathway has a first end attached to the surface of the intermediate card and a second end positioned near a side wall of the housing. The first thermal pathway is configured to disperse heat from the intermediate card toward the second end of the first thermal pathway. The second thermal pathway is coupled to the second end of the first thermal pathway and is configured to disperse heat in a vertical plane adjacent and/or overlapping the side wall of the housing. The third thermal pathway is also coupled to the second end of the first thermal pathway. The third thermal pathway is configured to disperse heat in a longitudinal plane adjacent and/or overlapping the top wall of the housing.

In some embodiments, the first thermal pathway includes a first heat spreader attached to the active surface of the circuit board assembly that contains the heat generating components. An insulative layer is attached to and partially covering the first heat spreader. A thermal pad is attached to the portion of the first heat spreader not covered by the insulative layer. One or more heat pipes are coupled to and extends longitudinally away from the thermal pad, and a second heat spreader is coupled to and extends longitudinally away from the thermal pad.

In some embodiments, the second thermal pathway includes a thermal pad connected to the second end of the first thermal pathway, and a heat sink connected to the thermal pad. The heat sink has a first portion attached to and extending laterally away from the thermal pad, and a second portion integrally connected to the first portion and forming at least a portion of the side wall of the housing. In some embodiments, the second thermal pathway includes one or more heat exchange fins on an outer surface of the heat sink.

In some embodiments, the third thermal pathway includes a thermal pad attached to the second end of the first thermal pathway and a heat sink connected to the thermal pad with the thermal pad sandwiched between the heat sink and a portion of the first thermal pathway. The heat sink has a first portion attached to the thermal pad and a second portion connected to the first portion and defining at least a portion of the top or bottom wall of the sealed housing. In some embodiments, the second portion of the heat sink includes an outer surface having one or more heat exchange members exposed to ambient air external of the sealed housing.

For ease of reference, the sealed module and the multi-path thermal management system are sometimes described herein with reference to top and bottom, upper and lower, upwards and downwards, and/or horizontal plane, x-y plane, vertical, or z-direction relative to the spatial orientation of the embodiments shown in the figures. It is to be understood, however, that the thermal management system contained can be moved to, and used in, different spatial orientations without changing the structure and/or function of the disclosed embodiments of the present technology.

Further, although primarily discussed herein as a thermal management system positioned within a sealed communications module, one of skill in the art will understand that the scope of the invention is not so limited. For example, the thermal management system can also be used in unsealed electronics modules, such as a communications module or in various other electronic modules. Accordingly, the scope of the invention is not confined to any subset of embodiments and is confined only by the limitations set out in the appended claims.

Description of the Figures

FIG. 1 is a cross-sectional side view of a communications module 100 ("module 100") that includes a multi-path thermal management system 140 in accordance with aspects of the present technology. The module 100 of the present embodiment is a sealed module that includes an exterior housing 110 having opposing bottom and top walls 112 and 116, respectively, and opposing side walls 114 and 118, respectively, extending between the bottom and top walls 112 and 116 and surrounding an interior 120 of the module 100. In the illustrated embodiment, the bottom, top, and side walls 112, 116, and 114, respectively, are metal or another highly thermally conductive material.

The interior 120 includes a bottom card region 122, an intermediate card region 124, and a top card region 126, each providing a space for one or more electronic cards (e.g., circuit board assemblies). Since the module 100 is sealed (e.g., by the exterior housing 110 and/or one or more other components of the module 100), the interior 120 and electronic components within the interior are protected from moisture, water, dust, debris, and various other contaminants. The sealed configuration thereby provides a protected space for the one or more cards in any of the regions 122, 124, 126 of the interior 120. However, the sealed configuration also prevents airflow through the interior 120 for heat transfer away from the cards and/or other components in the interior 120. For example, in the illustrated embodiment, the intermediate card region 124 includes an intermediate high power graphics card 130 having multiple heat-generating electronic components 136 thereon (e.g., one or more circuit board assemblies, such as an AI Graphics card with a graphics processing unit (GPU) chip, multiple memory chips, multiple power modules, and/or other suitable components).

The bottom card region 122 and top card region 126 are located adjacent to the housing's bottom and top exterior walls 112 and 116 and can be configured to direct heat toward the exterior walls. The intermediate card region 124, however, is isolated within the housing 110 between cards installed in the bottom and top card regions 122 and 126. The multi-path thermal management system 140 attached to the intermediate card 130 and configured to draw heat away from the intermediate card 130 to the exterior of the housing 110.

In the illustrated embodiment, the thermal management system 140 includes three thermal pathways. A first thermal pathway 150 is attached to the intermediate card 130. A second thermal pathway 170 is connected to a first portion of the first thermal pathway 150 and to a thermally conductive side wall 114 of the housing 110. A third thermal pathway 180 is connected to a second portion of the first thermal pathway 150 and to a thermally top or bottom wall 116 or 112 of the housing 110. The first thermal pathway 150 includes a plurality of components configured to draw heat laterally away from the intermediate card 130 toward the side wall 114, such as a rear wall of the module's exterior housing 110.

The second thermal pathway 170 includes a plurality of components configured to draw heat out of the first thermal pathway 150 and disperse the heat in a vertical plane. In some embodiments, the vertical plane is adjacent the side wall 114 of the exterior housing 110. The second thermal pathway 170 can be integrated into the side wall 114, such that the vertical plane at least partially overlaps with the side wall 114.

The third thermal pathway 180 includes a plurality of components configured to draw heat out of the first thermal pathway 150 and disperse the heat in a longitudinal plane. In some embodiments, the longitudinal plane is adjacent the top wall 116 of the exterior housing 110. The third thermal pathway 180 can be integrated into the top wall 116, such that the longitudinal plane at least partially overlaps with the top wall 116. Further details on each of the thermal pathways, as well as the arrangement of each of the components therein, are described in more detail below.

Figure 2:
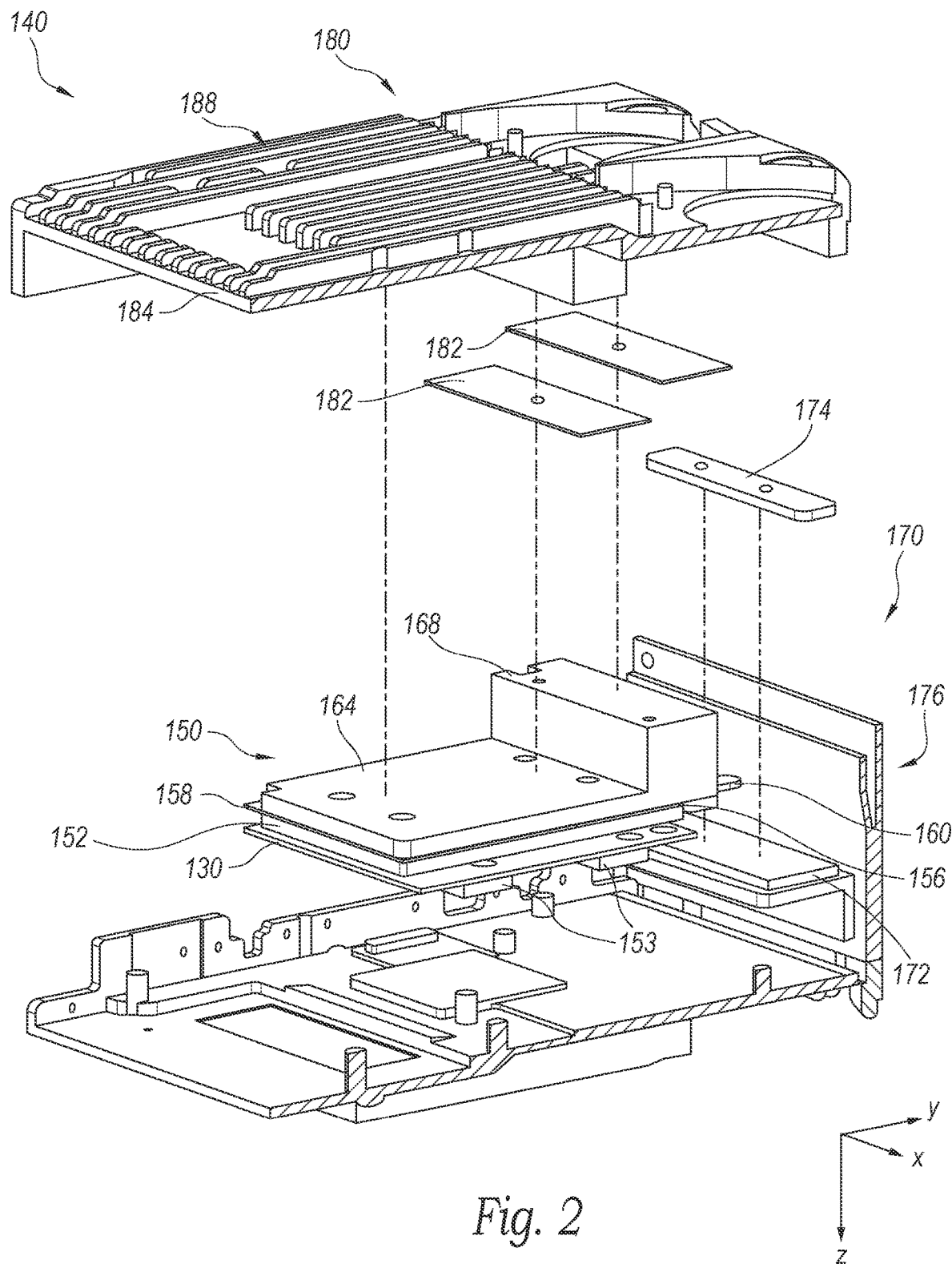
FIG. 2 is an exploded view of the components of the thermal management system in accordance with aspects of the present technology.

FIG. 2 is a partially exploded isometric view of the components of the thermal management system 140, and FIG. 3 is a partially exploded isometric view of the components of first thermal pathway 150. The first thermal pathway 150 has a substantially planar, thermally conductive lower heat spreader 152 connected to the intermediate card 130, one or more clamping plates 153, a thermal insulator 156, a thermal pad 158, one or more heat pipes 160, and an upper heat spreader 164. The second thermal pathway 170 is connected to the first thermal pathway 150 and includes a thermal pad 172, one or more heat pipe clamping plates 174, and a vertical heat sink 176. The third thermal pathway 180 is also connected to the first thermal pathway 150 and includes one or more thermal pads 182 and a horizontal heat sink 184. The first, second, and third thermal pathways 150, 170, and 180, respectively, are configured to efficiently transfer heat away from at least the intermediate card 130 contained within the sealed housing 110 for dissipation to the ambient environment external of the module 100. Further details on the configuration and operation of each of the thermal pathways are described in more detail below.

In some embodiments, the components of the thermal management system 140 can be off-the-shelf components for simplicity and to keep production and maintenance costs low. In these embodiments, the specialized arrangement of the components allows the thermal management system 140 to transfer and dissipate heat more effectively and efficiently than any of the components alone. Further, the specialized arrangement of the components allows the thermal management system 140 to disperse heat more effectively and more efficiently than any of the thermal pathways alone. In some embodiments, one or more of the components can be configured for thermally interconnecting the thermal pathways together for the selected thermal transfer relative to the heat generating components within the module's housing.

In the embodiment illustrated in FIG. 3, the first thermal pathway has the lower heat spreader 152 positioned atop the intermediate card 130. For example, the heat spreader 152 has opposing bottom and top surfaces 154*a* and 154*b*, respectively, and the illustrated heat spreader 152 is attached to the intermediate card 130 by fasteners and/or other attachment means, such that the bottom surface 154*a* is attached to or is otherwise immediately adjacent to a top surface 132 of the intermediate card 130.

The heat spreader 152 is made of metal or other highly thermally conductive material and is configured to draw heat generated by the components of the intermediate card 130 out of the top surface 132 and spread the heat across the heat spreader 152. The thermal insulator 156 is attached to the top surface 154*b* of the heat spreader 152 along only a first portion a first portion 155*a* of the heat spreader 152, so as to direct heat toward a second portion 155*b* away from the thermal insulator 156. The thermal pad 158 is attached to the top surface 154*b* of the heat spreader 152 at the second portion 155*b* and is configured to carry heat away from the heat spreader 152. The thermal insulator 156 at least partially blocks heat transfer out of the heat spreader 152 through the first portion 155*a*, and the thermal pad 158 creates a low resistance thermal path to draw heat away from the heat spreader 152 through the second portion 155*b*. As a result, the combination of the thermal insulator 156 and the thermal pad 158 concentrate and direct the heat to flow outwards through the second portion 155*b* of the top surface 154*b*.

In some embodiments, the thermal insulator 156 also at least partially covers the sides of the heat spreader 152 and/or the intermediate card 130, thereby further forcing the heat flow path through the second portion 155*b* of the top surface 154*b*. The upper surfaces of the thermal insulator 156 and the thermal pad 158 are generally coplanar. In other embodiments, the upper surfaces of the thermal pad 158 and the thermal insulator 156 can be vertically offset, for example to mate with other components in the first thermal pathway 150. In some embodiments, the first portion and the second portion cover the entire top surface of the heat spreader 152.

The first thermal pathway 150 of the illustrated embodiment includes the heat pipes 160 positioned atop the thermal insulator 156 and the thermal pad 158. More specifically, the heat pipes 160 have first end portions 162*a* (e.g., "warm ends") thermally connected to an upper surface of the thermal pad 158. The heat pipes 160 extend a first distance laterally away from the thermal pad 158, across the thermal insulator 156, and second end portions 162*b* (e.g., "cold ends") of the heat pipes extend away from the thermal insulator 156. The heat pipes 160 facilitate heat flow from the first end portions 162*a* to the second end portions 162*b*, and therefore efficiently carrying heat generated from the intermediate card away from the heat spreader 152 and the thermal pad 158.

In the illustrated embodiment, the heat pipes 160 are captured against the thermal insulator 156 and the thermal pad 158 by a bottom surface of the upper heat spreader 164. The upper heat spreader 164 also includes a first end portion 166*a* that extends across and is thermally connected to the upper surface of the thermal pad 158. A second end portion 166*b* of the upper heat spreader 164 extends across and is thermally connected to the thermal insulator 156. The heat pipes 160 are captured between the first end portion 166*a* of the upper heat spreader 164 and the thermal pad 158 and between the second end portion 166*b* and the thermal insulator 156. The cool ends of the heat pipes 160 extend laterally away from second end portion 166*b* of the upper heat spreader 164. In the illustrated embodiment, the second end portion 166*b* of the upper heat spreader 164 includes an enlarged heat sink 168 configured to store heat away from the thermal pad 158. Accordingly, the upper heat spreader 164 has a stepped configuration with a first portion 165*a* generally corresponding to the laterally extending body of the heat spreader 164 and a second portion 165*b* generally corresponding to the heat sink 168.

In the illustrated embodiment, the bottom surface of the upper heat spreader 164 includes heat pipe channels 166 each receive a portion of a respective heat pipe 160, such that the first end portion of the upper heat spreader 164 can draw heat from the heat pipes 160 and direct the heat to the heat sink 168 on the second end portion 166*b* of the upper heat spreader 164. In other embodiments, the bottom surface of the upper heat spreader 164 can include a single channel that receives all or a plurality of the heat pipes 160. In other embodiments, the upper heat spreader 164 does not have a heat pipe channel, and the bottom surface is flat and sits atop the heat pipes 160. In the illustrated embodiment, the components of the first thermal pathway 150 are securely held together through the clamping plates 153 and inserts through the corresponding holes. In some embodiments, various other fasteners (e.g., adhesives, screws, nails, clamps for each component, or other suitable fasteners) can be used in addition to, or as an alternative to, the clamping plates 153.

Figure 4:
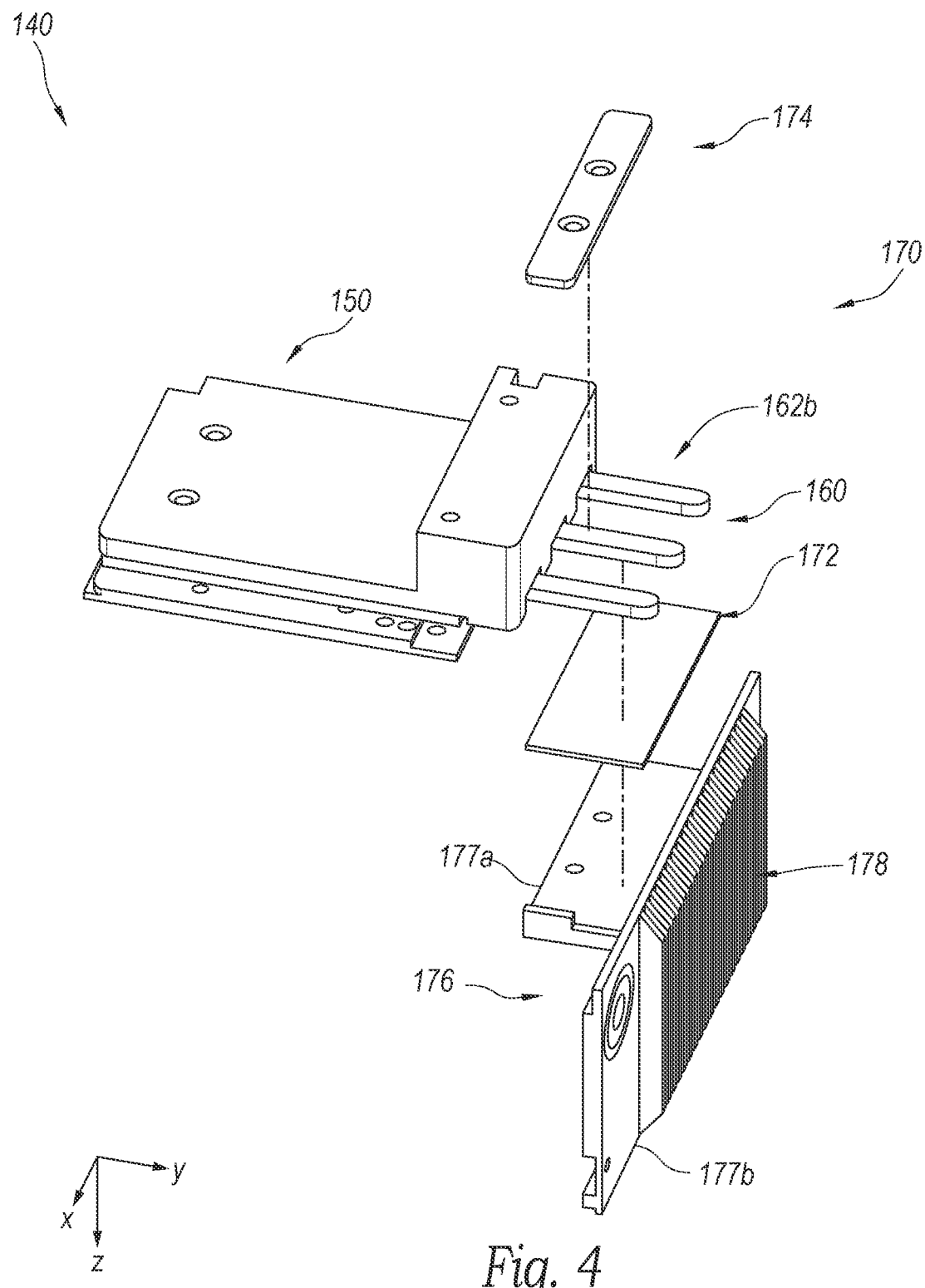
FIG. 4 is a partially exploded isometric view of the components of a second thermal pathway of the thermal management system connected to the first thermal pathway of FIG. 3.

FIG. 4 is a partially exploded isometric view of the components of the second thermal pathway 170 of the thermal management system 140 connected to the first thermal pathway 150. As indicated above, the second thermal pathway 170 has the thermal pad 172, which are connected to the second end portions 162b (i.e., the "cold ends") of the heat pipes 160 of the first thermal pathway 150. In the illustrated embodiment, a top surface of the thermal pad 172 is securely held against and thermally coupled to the second end portions 162b of the heat pipes 160 by the clamping plates 174. The vertical heat sink 176 includes a support arm portion 177a thermally connected to the thermal pad 172 and extending laterally outwardly toward a body portion 177b of the vertical heat sink 176. Accordingly, the vertical heat sink 176 of the illustrated embodiment has a generally T-shaped configuration.

The thermal pad 172 of the second thermal pathway 170 provides a conductive thermal path that receives heat from the heat pipes of the first thermal pathway 150. The support arm portion 177a draws heat out of the thermal pad 172 and disperses the heat toward the body portion 177b. In the illustrated embodiment, the body portion 177b forms at least a portion of an end wall or other sidewall 114 of the housing 110 of the sealed module 10. The body portion 177b is exposed to or otherwise in thermal communication with the exterior ambient environment surrounding the module 10.

In the illustrated embodiment, the body portion 177b of the vertical heat sink 176 includes a plurality of external fins 178 or other heat dissipation features exposed to the exterior ambient environment. The external fins 178 increase the surface area of the vertical heat sink 176, thereby increasing the heat dissipation capacity of the second thermal pathway to extract heat generated within the sealed module 10, such as from the intermediate card 130, and to exhaust the heat through the vertical heat sink 176 to the exterior environment. Heat dissipation can be increased by directing airflow across the external fins 178 and the end wall of the module.

In some embodiments, the second thermal pathway 170 also includes a horizontal heat sink 179 (FIG. 5) thermally coupled to the vertical heat sink 176. The horizontal heat sink 179 draws heat out of the vertical heat sink 176 and distributes the same in a second longitudinal plane. In some embodiments, the second longitudinal plane forms at least a portion of the bottom wall 112 of the module's sealed housing 110 (see FIG. 1). In some embodiments, the second longitudinal plane at least partially overlaps with the bottom wall 112 of the exterior housing 110, for example in embodiments in which the horizontal heat sink 179 makes up the bottom wall 112. The addition of the horizontal heat sink 179 further allows the thermal management system 140 to draw heat from the bottom card or other heat within the interior 120 to the exterior bottom surface of the housing's sealed housing 110. As a result of the combination of the first and second thermal pathways 150 and 170, the thermal management system 140 is able to efficiently draw heat away from the intermediate card 130 and from the interior 120 of the housing 110, without introducing an airflow into the sealed interior 120 (see FIG. 1). The efficiency of the thermal management system 140 is further increased by the inclusion of the third thermal pathway 180.

Figure 5:
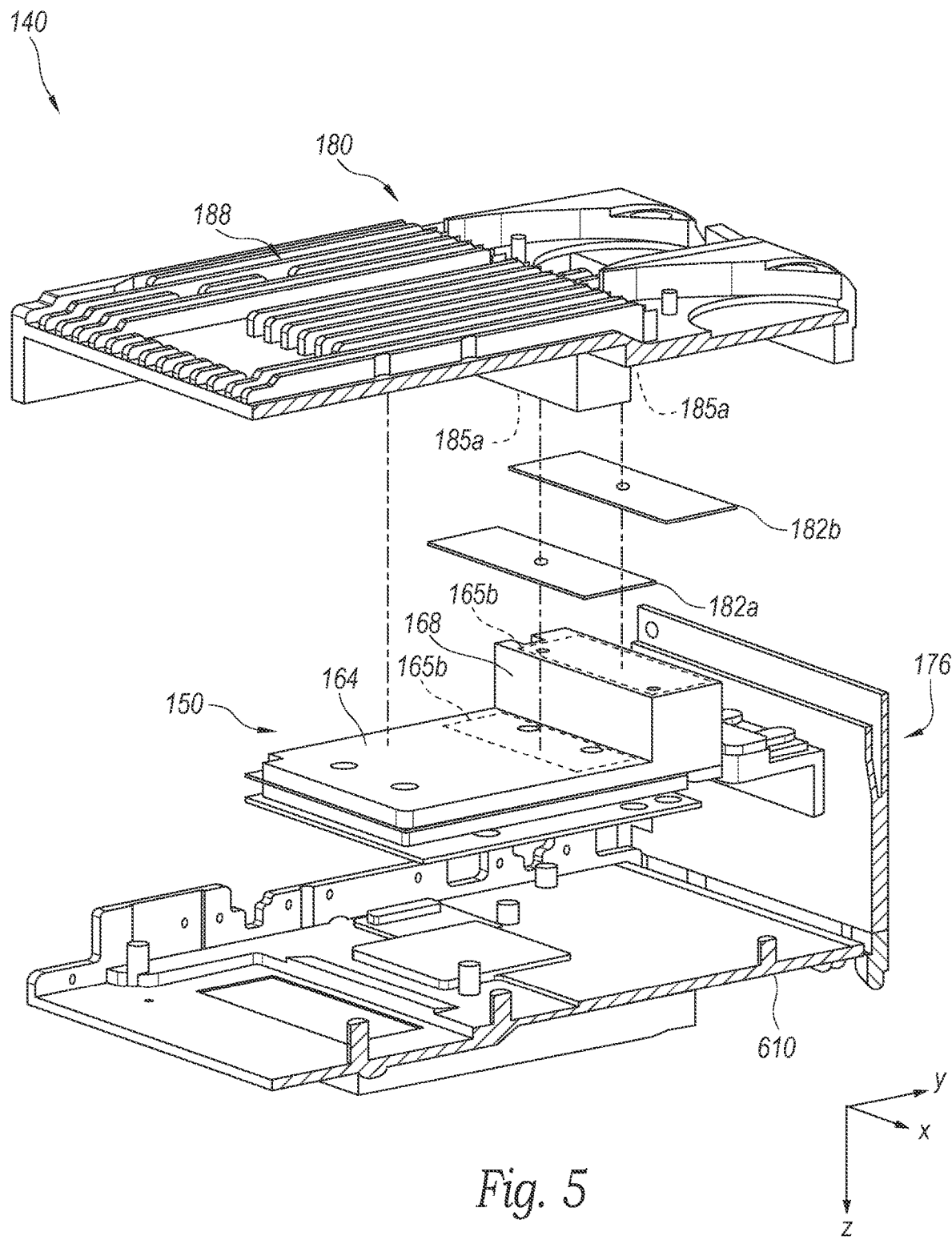
FIG. 5 is a partially exploded isometric view of the components of a third thermal pathway of the thermal management system disposed over the first and second thermal pathways and in accordance with aspects of the present technology.

FIG. 5 is a partially exploded isometric view of the components of the third thermal pathway 180 of the thermal management system 140 positioned adjacent to the first and second thermal pathways 150 and 170. In the illustrated embodiment, the third thermal pathway 180 includes the horizontal heat sink 184 that has several features discussed below and that forms at least a portion of the top wall 112 of the sealed housing 110 of the module. Accordingly, an exterior portion of the horizontal heat sink 184 is exposed to the ambient exterior environment around the module 100, and an interior portion faces into the interior of the housing 110.

The interior portion of the horizontal heat sink 184 is coupled to two thermal pads 182 (referred to individually as a first thermal pad 182a and a second thermal pad 182b) mounted atop the upper heat spreader 164 of the second thermal pathway 170. The first thermal pad 182a is securely and thermally connected to the upper heat spreader's enlarged heat sink 168, and the second thermal pad 182b is securely and thermally connected to the top of the upper heat spreader's second portion 165b. In the illustrated embodiment, the second thermal pad 182b is adhered to the upper heat spreader's second portion 165b on the enlarged heat sink 168. The first and second thermal pads 182a and 182b can be made of a metal, metal allow, or other highly thermally conductive material.

The interior portion of the horizontal heat sink 184 has an enlarged heat sink block 185a extending downwardly into the interior and toward the first thermal pathway 150. In the illustrated embodiment, the enlarged heat sink block 185a is similarly sized and immediately adjacent to the heat sink 168 on the second end portion of the upper heat spreader 164 of the first thermal pathway 150, such that the heat sink blocks interleave with each other. The bottom surface of the heat sink block 185a is connected to the first thermal pad 182a, such that the first thermal pad 182a is sandwiched between the enlarged heat sink block 185a of the third thermal pathway and the upper heat spreader's second portion 165b of the first thermal pathway 150. Accordingly, heat from the first thermal pathway 150 can flow through the first thermal pad 182a and the enlarged heat sink block 185a to the exterior surface of the horizontal heat sink 184 facing the module's exterior environment.

The interior portion of the horizontal heat sink 184 adjacent to the enlarged heat sink block 185a is attached to the second thermal pad 182b, such that the second thermal pad 182b is sandwiched against the top surface of the heat sink 168 on the second end portion 166b of the upper heat spreader 164. This configuration allows the thermal pads 182a and 182b to each facilitate the transfer of heat from the first thermal pathway 150 into the third thermal pathway 180. That is, the thermal pads 182a and 182b direct heat through and out of the second end portion 166b of the upper heat spreader 164 and into the horizontal heat sink 184 to be dispersed to the exterior of the module 100.

Further, to match the stepped upper surface of the upper heat spreader 164 of the second thermal pathway 170, the horizontal heat sink 184 of the third thermal pathway 180 is a generally T-shaped component with the leg of the T-shape defined by the enlarged heat sink block 185a that extends downwardly toward the first thermal pathway 150. The generally horizontal portion 186b of the horizontal heat sink 184 forms the top leg of the T-shape. In the illustrated embodiment, the generally horizontal portion 186b of the horizontal heat sink 184 also includes a plurality of external fins 188 or other heat dissipation features exposed to the exterior ambient environment and that define an external top surface of the top wall 112 of the module. The external fins 188 increase the exterior surface area of the horizontal heat sink 184, thereby allowing heat directed into the horizontal heat sink 184 to be more quickly dissipated by an exterior airflow across the external top surface.

In some embodiments, the top wall 112 of the module's sealed exterior housing 110 can include one or more external fans mounted in fan recesses configured to position the fans to direct external airflow over the external fins on the generally horizontal portion 186b of the horizontal heat sink 184. Other external fans can be provided on the module to cause airflow over the exterior of the module so as to facilitate heat transfer out of the module's interior also include a plurality of external fins 188 or other heat dissipation features exposed to the exterior ambient environment and that define an external top surface of the top wall 112 of the module. The combination of the third thermal pathway 180 with the first and second thermal pathways 150 and 170, respectively, allows the thermal management system 140 to efficiently draw heat away from the intermediate card 130 within the sealed interior, still without introducing an airflow into the interior 120 of the module 100, thereby risking the introduction of contaminants.

Figure 6:
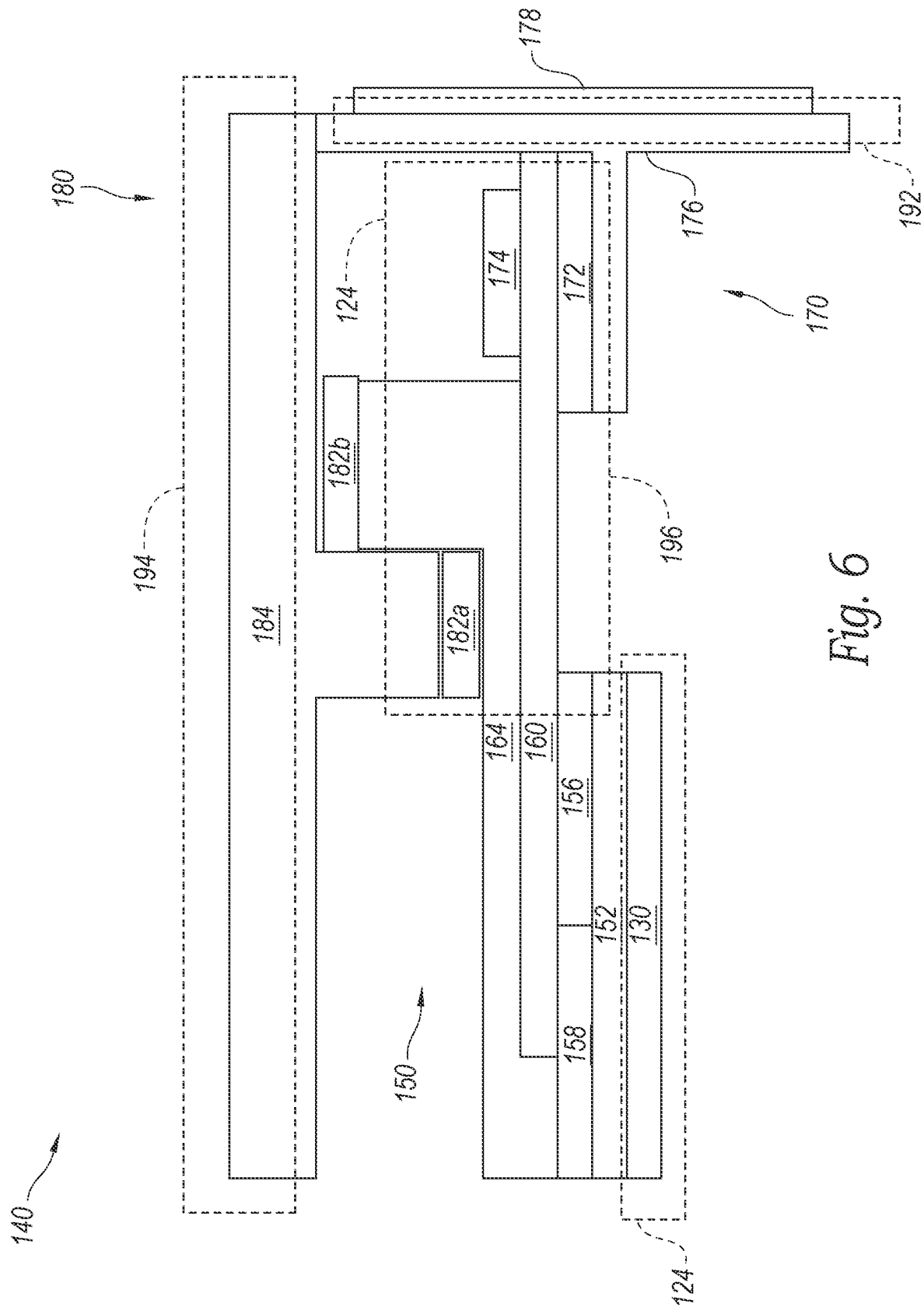
FIG. 6 is a block diagram of an embodiment of the thermal management system of FIG. 1.

FIG. 6 is a partially schematic block diagram of the thermal management system 140 of FIG. 1 illustrating further details on the arrangement of the components in accordance with some embodiments of the present technology. The combination of the first, second, and third thermal pathways 150, 170, and 180, respectively, is configured to draw heat away from the intermediate card region 124 and disperse the heat in a vertical plane 192 as well as a longitudinal plane 194, both a distance from the intermediate card region 124. The first thermal pathway 150 is attached to the top surface 132 of the intermediate card 130 and extends from the top surface 132 to a heat transfer area 196 spaced laterally apart from the top surface 132. The first thermal pathway 150 draws heat from the intermediate card 130 to the heat transfer area 196 spaced laterally apart from the top surface 132. Further, the combination of features in the first thermal pathway 150 is configured to concentrate heat flow out of the heat spreader 152 and into the heat pipes 160 and the heat spreader 164. As a result, the first thermal pathway both efficiently disperses heat to the heat transfer area 196 and reduces the amount of heat that disperses elsewhere in the interior 120.

The second thermal pathway 170 is thermally coupled to the first thermal pathway 150 in the heat transfer area 196 and extends in the vertical plane 192. The second thermal pathway 170 is configured to draw heat out of the first thermal pathway 150 in the heat transfer area 196 and disperse the heat in the vertical plane 192. The vertical plane can be adjacent to or coincide with at least a portion of the end wall or other side wall 114 of the housing 110 (see FIG. 1). Accordingly, the second thermal pathway 170 draws heat out of the first thermal pathway 150 and disperses the heat on and/or adjacent to an exterior surface of the module 100, such that the heat is removed from the sealed housing's interior 120.

The third thermal pathway 180 is thermally coupled to the first thermal pathway 150 in the heat transfer area 196 and extends in the longitudinal plane 194. The third thermal pathway 180 is configured to draw heat out of the first thermal pathway 150 in the heat transfer area 196 and disperse the heat in the longitudinal plane 194. The longitudinal plane 194 can be adjacent to or coincide with at least a portion of the top wall 116 of the housing 110 (see FIG. 1). Accordingly, the third thermal pathway 180 draws heat out of the first thermal pathway 150 and disperses the heat on and/or adjacent to an exterior surface of the module 100, such that additional heat is removed from the sealed housing's interior 120.

Figure 7:
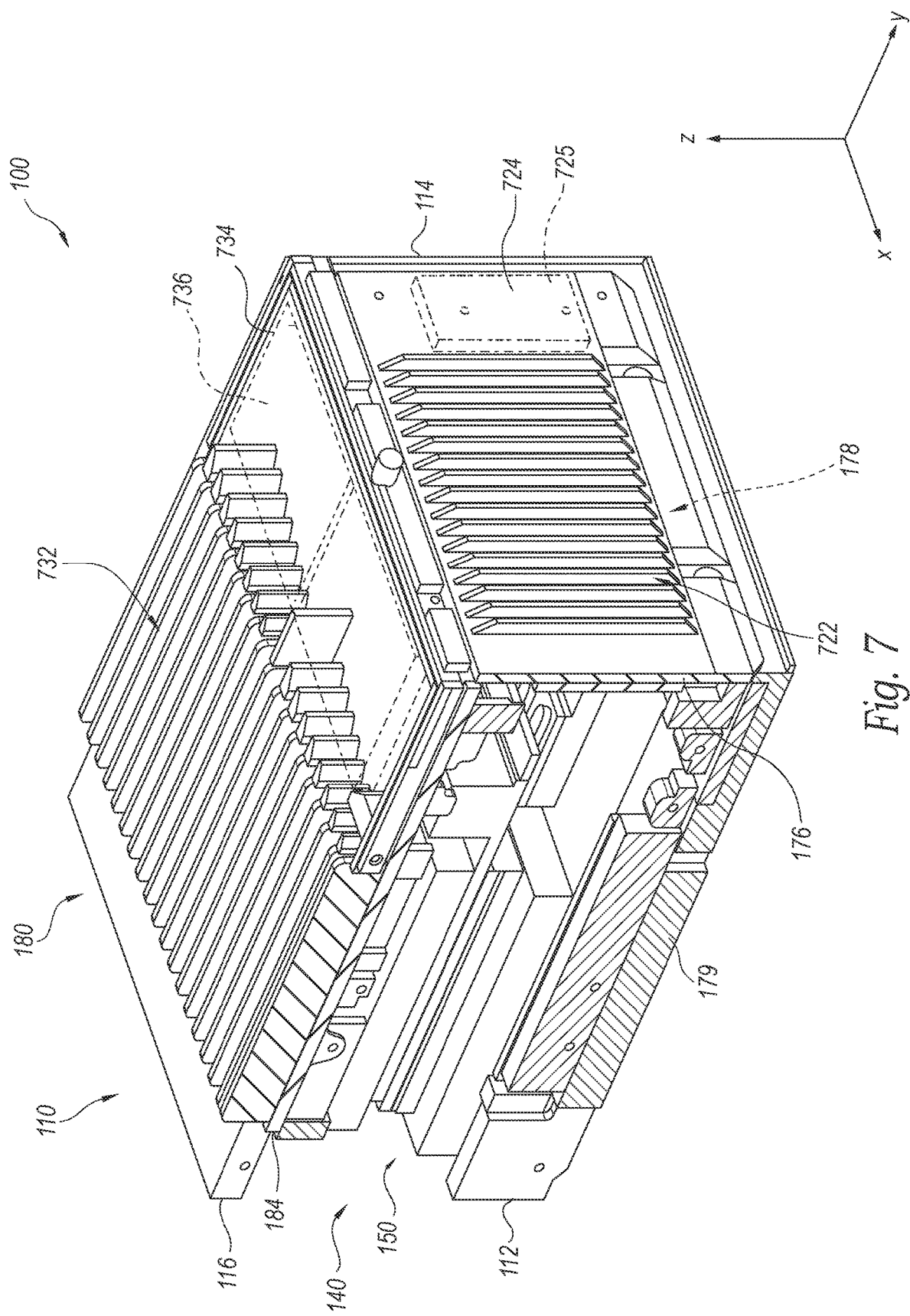
FIG. 7 is a partial isometric view of the exterior of the module in accordance with aspects of the embodiments of the present technology.

FIG. 7 is an isometric cross-sectional side view of the module 100 in accordance with aspects of the present technology. In the illustrated embodiment, the external surfaces of the thermal management system 140 (e.g., the external side surface of the vertical heat sink 176 and the external top surface of the horizontal heat sink 184) are adjacent and partially covered by the housing 110 of the module 100. The exterior housing 110 includes external features configured to aid in cooling the external surfaces of the thermal management system 140. For example, the side wall 114 can include external airflow pathways 722 generally corresponding to the external fins 178 of the vertical heat sink 176 in the second thermal pathway 170. The airflow pathways 722 allow and/or direct external airflow (e.g., from one or more external fans) over the external fins 178, which can draw heat out of the external fins 178 and therefore out of the second thermal pathway 170 and away from the module 100. The side wall 114 also includes a mounting region 724 configured to receive and position an external fan (not shown) to direct airflow through the airflow pathways 722.

In various embodiments, the side wall 114 can include various other heat distributing features configured to draw heat out of the second thermal pathway 170, such as water-based cooling systems, other air-flow based systems, and/or other active coolers (e.g., a thermoelectric cooler coupled to the external side surface of the vertical heat sink 176). In some embodiments, the heat distributing features described herein with respect to the side wall 114 can be integrally formed with the vertical heat sink 176. For example, in some embodiments, the external side surface of the vertical heat sink 176 can make up the side wall 114, and contain the mounting region 724 for an external fan 725 (shown schematically in phantom lines).

Similar to the side wall 114, the top wall 116 includes airflow pathways 732 and a mounting region 734. In the illustrated embodiment, one or more external fans 736 (illustrated schematically in phantom lines) can be mounted to the mounting region 734 and coupled to the airflow pathways 732 to direct an external airflow therein. The airflow pathways 732 generally correspond to the external fins 188 of the horizontal heat sink 184 of the third thermal pathway 180. Accordingly, as the external airflow enters the airflow pathways 732, the external airflow moves over and draws heat out of the external fins 188 before new air in the external airflow arrives. The external airflow draws heat out of the third thermal pathway 180, thereby allowing the thermal management system 140 to draw further heat out of the interior 120 of the module 100.

In various embodiments, the top wall 116 can include various other heat distributing features configured to draw heat out of the third thermal pathway 180, such as water-based cooling systems, other air-flow based systems (e.g., external airflow pathways generally corresponding to channels in the external top surface of the horizontal heat sink 184), and/or other active coolers (e.g., a thermoelectric cooler coupled to the external top surface of the horizontal heat sink 184). In some embodiments, the heat distributing features described herein with respect to the top wall 116 can be integrally formed with the horizontal heat sink 184. For example, in some embodiments, the external surface of the horizontal heat sink 184 can make up the top wall 116, and contain the mounting region 734 for the external fan 736.

From the foregoing, it will be appreciated that specific embodiments of the technology have been described herein for purposes of illustration, but well-known structures and functions have not been shown or described in detail to avoid unnecessarily obscuring the description of the embodiments of the technology. To the extent any material incorporated herein by reference conflicts with the present disclosure, the present disclosure controls. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Furthermore, as used herein, the phrase "and/or" as in "A and/or B" refers to A alone, B alone, and both A and B. Additionally, the terms "comprising," "including," "having," and "with" are used throughout to mean including at least the recited feature(s) such that any greater number of the same features and/or additional types of other features are not precluded.

Various modifications may be made without deviating from the disclosure or the technology. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Furthermore, although advantages associated with certain embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. A thermal management system for a sealed communication module having an onboard card with at least one electronic component, the thermal management system comprising: a first thermal pathway thermally coupled to the card and configured to transport heat from an upper surface of the card toward a transfer area spaced laterally apart from the upper surface; a second thermal pathway thermally coupled to the first thermal pathway in the transfer area and configured to disperse the heat in a vertical plane spaced laterally apart from the transfer area; and a third thermal pathway thermally coupled to the first thermal pathway in the transfer area and configured to disperse the heat in a horizontal plane spaced vertically apart from the transfer area; and the first thermal pathway comprises: a first heat spreader having a first surface attached to the upper surface of the card and a second surface opposite the first surface; an insulative layer at least partially covering the second surface of the first heat spreader, wherein the insulative layer at least partially blocks heat from dispersing out from an insulated portion of the second surface; a thermal pad attached to a portion of the second surface of the first heat spreader away from the insulative layer; one or more heat pipes extending a distance in a horizontal direction from the thermal pad to the transfer area, each of the one or more heat pipes having a first end portion in thermal communication with the thermal pad and a second end portion opposite the first end portion disperses the heat to a vertical plane which at least partially overlaps with a side wall of a housing; and a second heat spreader having a first portion in thermal communication with the thermal pad with the thermal pad between the first portion and the second surface of the first heat spreader, and a second portion opposite the first portion and coupled to the one or more heat pipe, wherein the second heat spreader at least partially covers an upper surface of the one or more heat pipes.

2. The thermal management system of claim 1 wherein the second end portion of the second heat spreader has a first connection area spaced vertically apart from the card by a first distance and a second connection area spaced vertically apart from the card by a second distance greater than the first distance.

3. The thermal management system of claim 1 wherein the second thermal pathway comprises:
a thermal pad in thermal communication with the first thermal pathway; and
a heat sink having a first portion attached to the thermal pad, a second portion integrally connected to the first portion and positioned in the vertical plane.

4. The thermal management system of claim 3 wherein the second thermal pathway has one or more fins protruding from an outer surface of second portion of the heat sink.

5. The thermal management system of claim 1 wherein the third thermal pathway includes:
a thermal pad in the transfer area and in thermal communication with the first thermal pathway; and
a heat sink having a first portion extending vertically away from the transfer area and a second portion integrally connected to the first portion and positioned in the horizontal plane.

6. The thermal management system of claim 5 wherein the third thermal pathway further includes one or more heat exchange members forming at least a portion of an outer surface of second portion of the heat sink.

7. A communications module comprising: a housing having an interior and having a top wall, a bottom wall, and a side wall extending between the top wall and the bottom wall; a card carrying a circuit board assembly having one or more electronic components, the card positioned in the interior between the top and bottom walls and having an upper surface; and a thermal management system coupled to the upper surface of the card, wherein the thermal management system is configured to disperse heat away from the card toward the top wall and the side wall of the housing, thermal management system including: a first thermal pathway having a first end portion coupled to the upper surface of the card and a second end portion opposite the first end portion, wherein the first thermal pathway is configured to disperse heat in a first longitudinal plane; a second thermal pathway connected to the second end portion of the first thermal pathway, wherein the second thermal pathway is configured to disperse heat in a vertical plane; and a third thermal pathway connected to the second end portion of the first thermal pathway, wherein the third thermal pathway is configured to disperse heat in a second longitudinal plane; and the first thermal pathway comprises: a first heat spreader having a first surface attached to the upper surface of the card and a second surface opposite the first surface; an insulative layer at least partially covering the second surface of the first heat spreader, wherein the insulative layer at least partially blocks heat from dispersing out from an insulated portion of the second surface; a thermal pad attached to a portion of the second surface of the first heat spreader away from the insulative layer; one or more heat pipes extending a distance in a horizontal direction from the thermal pad to the transfer area, each of the one or more heat pipes having a first end portion in thermal communication with the thermal pad and a second end portion opposite the first end portion disperses the heat to a vertical plane which at least partially overlaps with a side wall of a housing; and a second heat spreader having a first portion in thermal communication with the thermal pad with the thermal pad between the first portion and the second surface of the first heat spreader, and a second portion opposite the first portion and coupled to the one or more heat pipe, wherein the second heat spreader at least partially covers an upper surface of the one or more heat pipes.

8. The communications module of claim 7 wherein the first longitudinal plane is separated from the card by a vertical distance, and wherein the first thermal pathway comprises:
   a first component attached to the upper surface of the card and positioned to disperse heat from the upper surface;
   a second component attached to the first component, the second component having an insulating element and a conductive element, wherein the insulating element at least partially blocks heat flow out of the first component; and
   a third component attached to the second component, the third component extending in the longitudinal plane and configured to disperse heat in the longitudinal plane,
   wherein the first and second components are configured to disperse heat into the third component.

9. The communications module of claim 7 wherein the second thermal pathway comprises:
   a first component connected to the first thermal pathway; and
   a second component having a horizontal portion connected to the first component and a vertical portion integrally connected to the horizontal portion positioned in the vertical plane.

10. The communications module of claim 7 wherein third thermal pathway comprises:
   a first component connected to the first thermal pathway; and
   a second component having a vertical portion connected to the first component and a horizontal portion integrally connected to the vertical portion positioned in the second longitudinal plane.

11. The communications module of claim 7 wherein:
   the vertical plane of the second thermal pathway at least partially overlaps with the side wall of the housing;
   the side wall of the housing includes one or more first heat exchange members projecting away from the side wall and positioned to allow air to flow over and carry heat away from a first external surface of the second thermal pathway;
   the second longitudinal plane of the third thermal pathway at least partially overlaps with the top wall of the housing; and
   the top wall of the housing includes one or more second heat exchange members projecting away from the top wall and positioned to allow air to flow over and carry the heat away from a second external surface of the third thermal pathway.

12. A thermal management system for a sealed communication module having an onboard card with at least one electronic component, the thermal management system comprising: an insulative layer having a bottom surface; a first heat spreader having a top surface wherein the bottom surface of the insulative layer is attached to a first portion of the top surface of the first heat spreader to obstruct a transfer of heat out of the top surface, a bottom surface of the first heat spreader being attached to an active surface of the onboard card; a thermal pad attached to a second portion of the top surface of the first heat spreader, wherein the first portion and the second portion do not overlap; and at least one heat pipe positioned above the insulative layer and the thermal pad, the at least one heat pipe having a first portion positioned above the thermal pad and a second portion extending across the insulative layer and having a distal end a first distance from an edge of the insulative layer; and the distal end disperses the heat to a vertical plane which at least partially overlaps with a side wall of a housing.

13. The thermal management system of claim 12, wherein the first portion of the at least one heat pipe is in thermal communication with the thermal pad.

14. The thermal management system of claim 12, further comprising,
   a second heat spreader having a bottom surface, a first portion of the bottom surface being in thermal communication with the thermal pad, and a second portion being coupled to the at least one heat pipe.

15. The thermal management system of claim 14, wherein the thermal pad defines a heat flow path from the onboard card to the at least one heat pipe to the second portion of the second heat spreader.

16. The thermal management system of claim 14, wherein the bottom surface of the second heat spreader biases the at least one heat pipe against the insulative layer and the thermal pad.

17. The thermal management system of claim 12, wherein an upper surface of the insulative layer and an upper surface of the thermal pad are coplanar.

18. The thermal management system of claim 12, wherein the insulative layer partially covers at least one side surface of the first heat spreader.

19. The thermal management system of claim 12, wherein the insulative layer partially covers at least one side surface of the onboard card.

* * * * *